US009219489B2

(12) United States Patent
Jung

(10) Patent No.: US 9,219,489 B2
(45) Date of Patent: Dec. 22, 2015

(54) SUCCESSIVE APPROXIMATION REGISTER ANALOG-TO-DIGITAL CONVERTER

(71) Applicant: Beyond Innovation Technology Co., Ltd., Taipei (TW)

(72) Inventor: Kuang-Yu Jung, Taipei (TW)

(73) Assignee: Beyond Innovation Technology Co., Ltd., Taipei (TW)

( * ) Notice: Subject to any disclaimer, the term of this patent is extended or adjusted under 35 U.S.C. 154(b) by 0 days.

(21) Appl. No.: 14/487,096

(22) Filed: Sep. 16, 2014

(65) Prior Publication Data

US 2015/0162926 A1 Jun. 11, 2015

(30) Foreign Application Priority Data

Dec. 6, 2013 (TW) .............................. 102144918 A

(51) Int. Cl.
*H03M 1/34* (2006.01)
*H03M 1/08* (2006.01)
*H03M 1/00* (2006.01)
*H03M 1/46* (2006.01)

(52) U.S. Cl.
CPC ............ *H03M 1/0845* (2013.01); *H03M 1/002* (2013.01); *H03M 1/468* (2013.01)

(58) Field of Classification Search
CPC ...... H03M 1/468; H03M 1/462; H03M 1/002
USPC .................. 341/144, 155, 163, 122
See application file for complete search history.

(56) References Cited

U.S. PATENT DOCUMENTS

| 4,306,224 | A * | 12/1981 | Geller et al. .................. 341/161 |
| 4,649,371 | A * | 3/1987 | Kolluri .......................... 341/159 |
| 8,188,902 | B2 * | 5/2012 | Mitikiri et al. ................ 341/163 |
| 8,508,398 | B1 * | 8/2013 | Strode ............................ 341/161 |
| 8,610,465 | B2 * | 12/2013 | Jansson .......................... 327/63 |
| 2005/0225471 | A1 * | 10/2005 | Yukawa ......................... 341/163 |
| 2009/0309778 | A1 * | 12/2009 | Yoshinaga .................... 341/161 |
| 2011/0205099 | A1 * | 8/2011 | Inoue ............................ 341/158 |

FOREIGN PATENT DOCUMENTS

| TW | 200924379 | 6/2009 |
| TW | 201233069 | 8/2012 |
| TW | 201345164 | 11/2013 |

OTHER PUBLICATIONS

"Office Action of Taiwan Counterpart Application," issued on Sep. 8, 2015, pp. 1-7.

* cited by examiner

*Primary Examiner* — Peguy Jean Pierre
(74) *Attorney, Agent, or Firm* — Jianq Chyun IP Office

(57) ABSTRACT

A successive approximation register (SAR-ADC) including a digital-to-analog conversion (DAC) circuit, a sample-and-hold circuit, a comparison circuit and a SAR logic control circuit is provided. The DAC circuit is configured to convert an N-bits digital logic signal into a comparison signal, where N is a positive integer. The sample-and-hold circuit is configured to sample and hold an analog input signal. The comparison circuit is configured to use the analog input signal held by the sample-and-hold circuit as a basis for comparing with the comparison signal and thereby generates a comparison result signal. The SAR logic control circuit is configured to provide the N-bits digital logic signal and determine a logic state of each of bits of the digital logic signal one by one according to the comparison result signal, and thus generate a digital output signal related to the analog input signal.

9 Claims, 4 Drawing Sheets

SUCCESSIVE APPROXIMATION REGISTER ANALOG-TO-DIGITAL CONVERTER

CROSS-REFERENCE TO RELATED APPLICATION

This application claims the priority benefit of Taiwan application serial no. 102144918, filed on Dec. 6, 2013. The entirety of the above-mentioned patent application is hereby incorporated by reference herein and made a part of this specification.

BACKGROUND OF THE INVENTION

1. Field of the Invention

The invention relates to an analog-to-digital converter, and more particularly, relates to a successive approximation register analog-to-digital converter.

2. Description of Related Art

In recent years, as a trend in integrated circuit design, requirements for less power consumption, higher performance and less cost become even more stringent. In design of an analog front-end circuit, one efficient analog-to-digital converter (ADC) is capable of significantly improving overall performance for a system. The ADC is responsible for converting received analog signals into digital signals to be provided to a digital signal processing unit at back-end for operations. Therefore, dynamic range, resolution, accuracy, linearity, sampling speed, power consumption, and input stage characteristic of the ADC all become important parts for influencing overall performance of the system as well as important parameters for evaluating performance of a converter itself.

There is a wide variety of architectures for the existing ADC, such as a pipeline analog-to-digital converter (pipeline ADC) and a successive approximation register analog-to-digital converter (SAR-ADC); both are common architectures in the technical field. Among them, under the same specification requirement, the SAR-ADC is advantageous in having lower power consumption and smaller chip area as compared to the pipeline ADC. Therefore, technical development for a SAR-ADC architecture has gradually being taken seriously by the industry.

The existing SAR-ADC architecture generally includes parts such as a digital-to-analog converter (DAC), a comparison circuit, a SAR logic control circuit, and so forth. Specifically, during operations of an analog-to-digital conversion of the traditional SAR-ADC, the DAC normally uses a reference voltage as a basis for performing sample-and-hold on an analog input signal. Thereafter, a SAR logic control circuit uses a binary search algorithm to control a digital-to-analog conversion of the DAC, so that the DAC may generate a corresponding comparison signal. The comparison signal is related to a voltage difference value between analog voltages corresponding to different logic states and the analog input signal. Subsequently, the comparison circuit may use the reference voltage as a basis for comparing with the comparison signal, such that the SAR logic control circuit is capable of determining a logic state of each of bits of a digital logic signal one by one according to a comparison result of the comparison circuit.

In view of above operations, it can be known that, in order to realize the operations of the analog-to-digital conversion in the existing SAR-ADC architecture, it is required to provide the additional reference voltage as the basis for caparison of a comparator. In addition, for maintaining accuracy of the determination of the comparison circuit, operations of an offset cancellation are generally performed during a period before the analog-to-digital conversion is performed by the SAR-ADC. In such offset cancellation, it is also required to provide one reference voltage as a common-mode voltage for two input terminals of the comparison circuit, so as to cancel a voltage offset between the different input terminals of the comparison circuit.

Furthermore, based on the existing SAR-ADC architecture, the comparator is usually realized by utilizing a comparator composed of one single operation amplifier. Accordingly, when circuits are operated in high frequency, the comparator may cause the SAR-ADC to generate serious noise interference due to required operating current being greater.

SUMMARY OF THE INVENTION

The invention is directed to a successive approximation register analog-to-digital converter, which is capable of realizing operations of the offset cancellation and the analog-to-digital conversion without using the additional reference voltage, and reducing noise interference of the circuits operated in high frequency.

A successive approximation register (SAR-ADC) of the invention includes a digital-to-analog conversion (DAC) circuit, a sample-and-hold circuit, a comparison circuit and a SAR logic control circuit. The digital-to-analog conversion circuit is configured to convert an N-bits digital logic signal into a comparison signal in analog form, wherein N is a positive integer. The sample-and-hold circuit is configured to sample and hold an analog input signal. The comparison circuit is coupled to the digital-to-analog conversion circuit and the sample-and-hold circuit, and configured to use the analog input signal held by the sample-and-hold circuit as a basis for comparing with the comparison signal and thereby generate a comparison result signal. The SAR logic control circuit is configured to provide the N-bits digital logic signal and determine a logic state of each of bits of the digital logic signal one by one according to the comparison result signal, and thus generate a digital output signal related to the analog input signal.

In an embodiment of the invention, the comparison circuit includes a M-stage of comparison units connected in series and a latch unit. A first-stage comparison unit receives the analog input signal and the comparison signal from the sample-and-hold circuit and the digital-to-analog conversion circuit, respectively. The latch unit is coupled to an output terminal of a $M^{th}$-stage comparison unit, and configured to latch comparison result from the comparison units, and thereby generate the comparison result signal. Therein, M is a positive integer, and M is at least one quarter of N.

In an embodiment of the invention, the comparison circuit further includes a M-number of feedback units and a M-number of capacitor units. The M-number of feedback units each is coupled between an input terminal and an output terminal of corresponding one of the comparison units. The M-number of capacitor units each is coupled to the input terminal of corresponding one of the comparison units.

In an embodiment of the invention, each of the comparison units includes a differential output, and except for the last-stage comparison unit, a positive output terminal and a negative output terminal of a previous-stage comparison unit are coupled to a positive input terminal and a negative input terminal of a next-stage comparison unit respectively. Each of the feedback units includes a first feedback switch and a second feedback switch. The first feedback switch is coupled between the positive input terminal and the positive output terminal of the corresponding comparison unit. The second feedback switch is coupled between the negative input terminal and the negative output terminal of the corresponding comparison unit. Therein, the first and second feedback switches are controlled of the successive approximation register logic control circuit to be turned on or off.

In an embodiment of the invention, each of the capacitor units includes a first input capacitor and a second input capacitor. The first input capacitor is coupled to the positive input terminal of the corresponding comparison unit. The second input capacitor is coupled to the negative input terminal of the corresponding comparison unit.

In an embodiment of the invention, the successive approximation register logic control circuit turns on the first and second feedback switches of the feedback units during a sample-and-hold period, and turns off the first and second feedback switches of the feedback units during a charge-redistribution period.

In an embodiment of the invention, the sample-and-hold circuit includes a first sample switch, a second sample switch, and a hold capacitor. A first terminal of the first sample switch receives the analog input signal, and a second terminal of the first sample switch is coupled to one of the positive input terminal and the negative input terminal of the first-stage comparison unit. A first terminal of the second sample switch receives the analog input signal, and a second terminal of the second sample switch is coupled to another one of the positive input terminal and the negative input terminal of the first-stage comparison unit. A first terminal of the hold capacitor is coupled to the second terminal of the second sample switch, and a second terminal of the hold capacitor is coupled to a ground terminal.

In an embodiment of the invention, the successive approximation register logic control circuit turns on the first and second sample switches during a sample-and-hold period and thus holds the analog input signal in the hold capacitor, and turns off the first and second sample switches during a charge-redistribution period.

In an embodiment of the invention, the digital-to-analog conversion circuit includes a N-number of capacitors and a N-number of switch modules. First terminals of the capacitors are commonly coupled to the second terminal of the first sample switch. The N-number of switch modules are coupled to second terminals of the capacitors respectively, and controlled by the successive approximation register logic control circuit to selectively provide one of a high logic voltage, a low logic voltage and the analog input signal to the corresponding capacitors.

In an embodiment of the invention, the switch modules are controlled by the successive approximation register logic control circuit to provide the analog input signal to the corresponding capacitors during a sample-and-hold period, and the switch modules are controlled by the logic state of each of the bits of the digital logic signal to sequentially provide the high logic voltage or the low logic voltage to the corresponding capacitors during a charge-redistribution period, so as to generate the comparison signal.

In an embodiment of the invention, capacitance ratios of a first capacitor to a Nth capacitor are sequentially $2^{N-1}$ to $2^0$, and a most significant bit (MSB) to a least significant bit (LSB) of the N-bits digital logic signal sequentially and correspondingly control a first switch module to a Nth switch module during the charge-redistribution period.

Based on above, the embodiments of the invention propose a successive approximation register analog-to-digital converter, which is capable of simply using the analog input signal to serve as the common-mode reference voltage required for the analog-to-digital conversion and the offset cancellation. Therefore, the successive approximation register analog-to-digital converter according to the embodiments of the invention may realize the operations of the offset cancellation and the analog-to-digital conversion without using the additional reference voltage, and thereby simplify the overall circuit design. In addition, the proposed circuit architecture of the comparison units connected in series may also effectively reduce the noise interference of the successive approximation register analog-to-digital converter operated in high frequency, and thereby allow the successive approximation register analog-to-digital converter according to the embodiments of the invention to provide a more preferable signal-to-noise ratio characteristic.

To make the above features and advantages of the disclosure more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
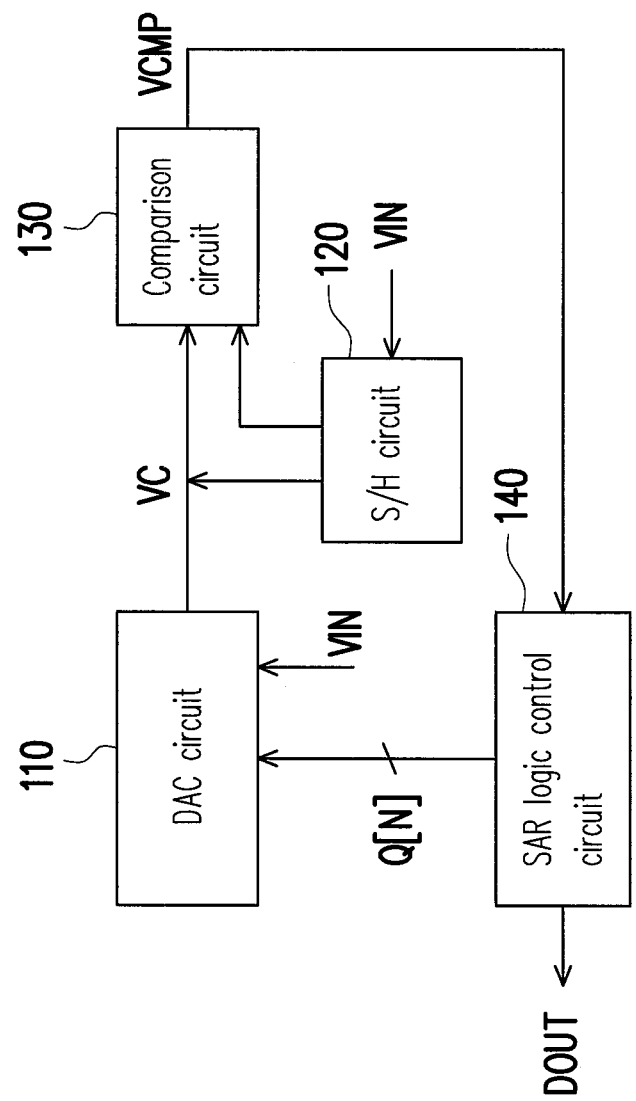
FIG. 1 is a schematic diagram of a successive approximation register analog-to-digital converter according to an embodiment of the invention.

Embodiments of the invention propose a successive approximation register analog-to-digital converter, which is capable of realizing operations of the offset cancellation and the analog-to-digital conversion without using the additional reference voltage to serve as the common-mode voltage, so as to simplify overall circuit design. In addition, the proposed circuit architecture may also effectively reduce the noise interference of the circuit operated in high frequency, and thereby allow the analog-to-digital converter according to the embodiments of the invention to provide a more preferable signal-to-noise ratio (SNR) characteristic. In order to make content of the present disclosure more comprehensible, embodiments are described below as the examples to prove that the present disclosure can actually be realized. Moreover, elements/components/steps with same reference numerals represent same or similar parts in the drawings and embodiments.

FIG. 1 is a schematic diagram of a successive approximation register analog-to-digital converter according to an embodiment of the invention. Referring to FIG. 1, a successive approximation register analog-to-digital converter (referred to as the SAR-ADC hereinafter) 100 of the present embodiment is adapted to convert an analog input signal VIN into a digital output signal DOUT of a N-bits resolution, wherein N is a positive integer (e.g., 4-bits, 12-bits, 16-bits, etc., but not limited thereto). The SAR-ADC 100 includes a digital-to-analog conversion circuit (referred to as the DAC circuit hereinafter) 110, a sample-and-hold (S/H) circuit 120, a comparison circuit 130 and a successive approximation register logic control circuit (referred to as the SAR logic control circuit hereinafter) 140.

In the present embodiment, the DAC circuit 110 is configured to convert a N-bits digital logic signal Q[N] received from the SAR logic control circuit 140 into a comparison signal VC in analog form. The sample-and-hold circuit 120 is configured to sample and hold the analog input signal VIN. The comparison circuit 130 is coupled to the DAC circuit 110 and the sample-and-hold circuit 120, and configured to use the analog input signal VIN held by the sample-and-hold circuit 120 as a basis for comparing with the comparison signal VC and thereby generate a comparison result signal VCMP. The SAR logic control circuit 140 determines a logic state of each of bits of the digital logic signal Q[N] one by one according to the comparison result signal VCMP, and thus generate the digital output signal DOUT related to the analog input signal VIN.

Specifically, operations of an analog-to-digital conversion of the SAR-ADC 100 may be divided into two periods/stages including a sample-and-hold (S/H) period and a charge-redistribution period. During the sample-and-hold period, the DAC circuit 110 and the sample-and-hold circuit 120 are controlled by the SAR logic control circuit 140 to hold and sample the analog input signal VIN, and the analog input signal VIN is provided to two input terminals of the comparison circuit 130 in a manner of common-mode, such that the operations of the offset cancellation may be performed on the comparison circuit 130 while initializing a common-mode gain of the comparison circuit 130 to 0.

After the sample-and-hold period is ended, the SAR-ADC 100 successively enters the charge-redistribution period. During the charge-redistribution period, the SAR logic control circuit 130 adopts a binary search algorithm to determine the logic state of each of the bits of the digital logic signal Q[N] one by one (this part will be further described in the following embodiments), so that the DAC circuit 110 may gradually generate the comparison signal VC having a voltage level approximating to that of the analog input signal VIN. After each of the bits of the digital logic signal Q[N] is adjusted by the SAR logic control circuit 140 according to the comparison result signal VCMP, the SAR logic control circuit 140 determines that the charge-redistribution period is ended, and generates the digital output signal DOUT according to the final logic state of the digital logic signal Q[N].

Figure 2:
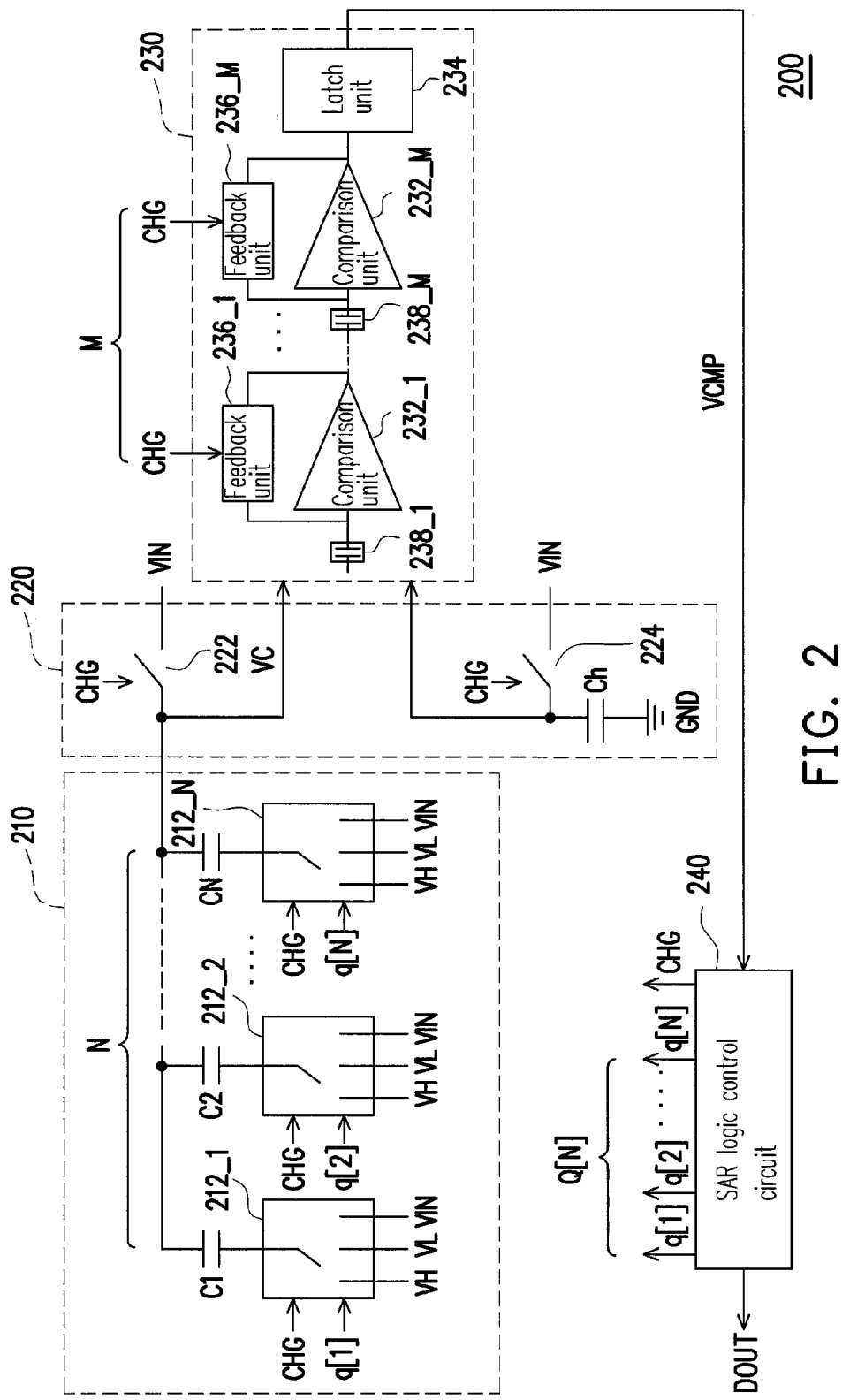
FIG. 2 is a schematic diagram of a successive approximation register analog-to-digital converter according to another embodiment of the invention.

An embodiment of FIG. 2 is provided below to further describe a specific architecture and operations of the SAR-ADC according the embodiments of the invention. FIG. 2 is a schematic view of a SAR-ADC according to another embodiment of the invention.

Referring to FIG. 2, a SAR-ADC 200 of the present embodiment includes a DAC circuit 210, a sample-and-hold circuit 220, a comparison circuit 230 and a SAR logic control circuit 240. The DAC circuit 210 includes a N-number of capacitors C1 to CN and a N-number of switch modules 212_1 to 212_N. The sample-and-hold circuit 220 includes sample switches 222 and 224 and a hold capacitor Ch. The comparison circuit 230 includes a M-stage of comparison units 232_1 to 232_M connected in series, a latch unit 234, a M-number of feedback units 236_1 to 236_M and a M-number of capacitor units 238_1 to 238_M, wherein M is a positive integer.

In the DAC circuit 210, first terminals of the capacitors C1 to CN are commonly coupled to the sample switch 222 of the sample-and-hold circuit 220. Capacitance ratios of the capacitor C1 to the capacitor CN may be sequentially designed to be $2^{N-1}$ to $2^0$. For instance, if the capacitance of the capacitor C1 is designed to be C, the capacitances of the capacitors C2, C3, . . . , CN may be sequentially designed to be C/2, C/4, . . . , $C/2^{N-1}$, and the rest may be deduced by analogy. The switch modules 212_1 to 212_N are coupled to second terminals of the capacitors C1 to CN respectively, and controlled by the SAR logic control circuit 240 to selectively provide one of a high logic voltage VH, a low logic voltage VL and the analog input signal VIN to the corresponding capacitors C1 to CN. The high logic voltage VH and the low logic voltage VL are an analog input range of the SAR-ADC 200 (i.e., a level of the analog input signal VIN falls between VH and VL).

In the present embodiment, the digital logic signal Q[N] for controlling the DAC circuit 210 may be composed of bits q[1] to q[N]. Herein, the bits q[1] to q[N] are sequentially a most significant bit (MSB) to a least significant bit (LSB) of the digital logic signal Q[N]. Each of the bits q[1] to q[N] may be considered as control signals for controlling the corresponding switch modules 212_1 to 212_N during the charge-redistribution period. In other words, the most significant bit q[1] to the least significant bit q[N] of the N-bits digital logic signal Q[N] may sequentially and correspondingly control switchings of the switch modules 212_1 to 212_N during the charge-redistribution period. For instance, during the charge-redistribution period, the switch modules 212_1 to 212_N may selectively provide the high logic voltage VH to the corresponding capacitors C1 to CN in response to the bits q[1] to q[N] being a high logic level (e.g., a logic level "1"), and selectively provide the low logic voltage VL to the corresponding capacitors C1 to CN in response to the bits q[1] to q[N] being a low logic level (e.g., a logic level "0").

The invention is further described herein by using SAR-ADC 200 being 4-bits for example (i.e., N=4). Accordingly, during the charge-redistribution period, if the digital logic signal Q[N] provided by the SAR logic control circuit 240 is "1000", it indicates that the first bit/the most significant bit q[1] is corresponding to the logic level "1", the second bit q[2] is corresponding to the logic level "0", the third bit q[3] is corresponding to the logic level "0", and the fourth bit/the least significant bit q[4] is corresponding to the logic level "0". Based on above-said logic states, the switch module 212_1 may provide the high logic voltage VH to the corresponding capacitor C1 in response to the bit q[1] being the logic level "1", and the switch module 212_2, 212_3 and 212_4 may provide the low logic voltage VL to the corresponding capacitors C2, C3 and C4 respectively in response to the bit q[2], q[3] and q[4] being the logic level "0". Therefore, under such configuration, the DAC circuit 210 is equivalent to the capacitors C2, C3 and C4 connected to in parallel, and the voltage level of the comparison signal VC generated by the DAC circuit 210 may be determined according to a result obtained by performing a voltage division on a voltage difference between the high logic voltage VH and the low logic voltage VL with respect to the capacitor C1 and said parallel capacitors (C2/C3/C4).

Herein, specific values are provided below for example. In case the high logic voltage VH being 3V, the low logic voltage VL being 0V and the capacitance ratios of the capacitors C1 to C4 sequentially being 1:½:¼:⅛, when the digital logic signal Q[N] with the logic state being "1000" is received by the DAC circuit 210, the capacitors C2, C3 and C4 are equivalent to one parallel capacitor, and the capacitance ratio of the parallel capacitor and the capacitor C1 is approximately 1:1 (which is 1:⅞ (½+¼+⅛) to be exact). Under such configuration, the capacitor C1 and the parallel capacitor (C2/C3/C4) approximately include the same resistance/impedance, such that the comparison signal VC having the voltage level approximately being 1.5 (½ of VH) may be generated after the voltage division is performed on the high logic voltage VH being 3V through the capacitor C1 and the parallel capacitor (C2/C3/C4). Operations of the DAC circuit 210 being 8-bits, 12-bits or other number of bits may be inferred by reference with above example, and thus related descriptions thereof are omitted hereinafter.

Herein, it is worth mentioning that, the designer may add a dummy capacitor having the capacitance identical to that of the capacitor CN and a switch module corresponding thereto (which are not illustrated) in the DAC circuit 210 based on design considerations, such that a voltage correspondence relationship in integer multiples may be provided between the comparison signal VC converted from the DAC circuit 210 and the high logic voltage VH, but the invention is not limited thereto.

In the sample-and-hold circuit 220, a first terminal of the sample switch 222 receives the analog input signal VIN, and a second terminal of the sample switch 222 is coupled to the first terminals of the capacitors C1 to CN of the DAC circuit 210 and one of a positive input terminal and a negative input terminal of a first-stage comparison unit 232_1. A first terminal of the sample switch 224 also receives the analog input signal VIN, and a second terminal of the sample switch 224 is coupled to another one of the positive input terminal and the negative input terminal of the first-stage comparison unit 232_1. A first terminal of the hold capacitor Ch is coupled to the second terminal of the sample switch 224, and a second terminal of the hold capacitor Ch is coupled to a ground terminal GND (0V). The sample switches 222 and 224 are synchronously controlled by a control signal CHG provided by the SAR logic control circuit 240 to be turned on or off.

In the comparison circuit 230, the comparison units 232_1 to 232_M may be comparison units having a differential output for example, wherein except for the last comparison unit 232_M, a positive output terminal and a negative output terminal of a previous-stage comparison unit are coupled to a positive input terminal and a negative input terminal of a next-stage comparison unit respectively. For example, the positive output terminal and the negative output terminal of the comparison unit 232_1 are coupled to the positive input terminal and the negative input terminal of the comparison unit 232_2 respectively, and so on for the rest of the comparison units 232_2 to 232_M−1. The latch unit 234 is coupled to an output terminal of the last-stage (a $M^{th}$-stage) comparison unit 232_M, and configured to latch comparison result from the comparison units 232_1 to 232_M, and thereby generate the comparison result signal VCMP indicating the voltage correspondence relationship between the comparison signal VC and the analog input signal VIN. The feedback units 236_1 to 236_M each is coupled between an input terminal and an output terminal of corresponding one of the comparison units 232_1 to 232_M. The feedback units 238_1 to 238_M each is coupled to an input terminal of corresponding one of the comparison units 232_1 to 232_M.

For overall operations of the analog-to-digital conversion of the SAR-ADC 200, during the sample-and-hold period, the SAR logic control circuit 240 first provides the enabled control signal CHG to turn on the sample switches 222 and 224 in the sample-and-hold circuit 220 and the feedback units 236_1 to 236_M corresponding to the respective comparison units 232_1 to 232_M, and simultaneously makes each of the switch modules 212_1 to 212_N to selectively provide the analog input signal VIN to the corresponding capacitors C1 to CN in response to the enabled control signal CHG.

Under such configuration, the analog input signal VIN is provided in the manner of common-mode to the two input terminals of the first-stage comparison unit 232_1, and the sample switch 224 being turned on may simultaneously make the analog input signal VIN to charge the hold capacitor Ch, such that the analog input signal VIN may be held in the hold capacitor Ch. In addition, the feedback units 236_1 to 236_M being turned on may establish a feedback path for short circuit between the input terminal and the output terminal of each of the comparison units 232_1 to 232_M, so that the analog input signal VIN may be provided to the input terminal/the output terminal of each of the comparison units 232_1 to 232_M through the capacitor units 238_1 to 238_M and the feedback units 236_1 to 236_M, so as to cancel the offset voltage of each of the comparison units 232_1 to 232_M while initializing/maintaining the common-mode gain of each of the comparison units 232_1 to 232_M to 0.

During the charge-redistribution period, the SAR logic control circuit 240 may switch the control signal CHG to disabled, so that the sample switches 222 and 224 and the feedback units 236_1 to 236_M are turned off, and each of the switch modules 212_1 to 212_N is changed to be controlled by the corresponding bits q[1] to q[N] of the digital logic signal Q[N] to determine whether to provide the high logic voltage VH or the low logic voltage VL to the corresponding capacitors C1 to CN.

Under such configuration, the SAR logic control circuit 240 may first provide one digital logic signal Q[N] with a preset logic state to control the DAC circuit 210. Take N=4 for example, based on the binary search algorithm, a preset digital logic signal Q[N] provided by the SAR logic control circuit 240 is generally "1000" or "0111" for example (i.e., in correspondence to the logic state of the ½ high logic voltage VH, but the invention is not limited thereto). Next, the comparison units 232_1 to 232_M may perform comparison operation stage by stage based on the comparison signal VC and the analog input signal. VIN held in the sample-and-hold circuit 220, so that the latch unit 234 may generate the corresponding comparison result signal VCMP according to the comparison result of the last-stage comparison unit 232_M.

At the time, the SAR logic control circuit 240 may determine whether the logic state of the most significant bit/the first bit q[1] is "1" or "0" according to the comparison result signal VCMP (corresponding to the comparison result of the preset comparison signal VC and the analog input signal VIN), and adjust the logic state of the next bit q[2]. Next, the DAC circuit 210 may successively generate the corresponding comparison signal VC according to the adjusted digital logic signal Q[N] for comparing with the analog input signal VIN, so that SAR logic control circuit 240 may determine the logic state of the next bit q[2] according to the comparison result signal VCMP corresponding to the comparison result of such comparison signal VC and the analog input signal VIN, and then adjust the logic state of the next bit q[3]. According to above operations, the SAR logic control circuit 240 may sequentially determine the logic state of each of the bits q[1] to q[N] during the charge-redistribution period.

More specifically, during the operation of determining the logic state of each of the bits q[1] to q[N] one by one, the DAC circuit 210 may generate the comparison signal VC gradually approximating the voltage level of the analog input signal VIN as the logic states the most significant bit q[1] to the least significant bit q[N] of the digital logic signal Q[N] are adjusted. In other words, when the charge-redistribution period is ended (after the logic state of the least significant bit q[N] is determined), the digital logic signal Q[N] decoded by the SAR logic control circuit 240 is the digital output signal DOUT corresponding to the analog input signal VIN.

In view of the specific operations of the SAR-ADC 200 as described above, it can be known that by disposing the sample-and-hold circuit 220 according to the embodiment of the invention, the SAR-ADC 200 may utilize the analog input signal VIN simultaneously provided to the positive/negative input terminals of each of the comparison units 232_1 to 232_M to serve as the common-mode voltage for canceling the offset voltage of each of the comparison units 232_1 to 232_M during the sample-and-hold period. Further, because the analog input signal VIN is continuously held in the hold capacitor Ch during the charge-redistribution period, the comparison circuit 230 is capable of directly using the analog input signal VIN held in the hold capacitor Ch as a basis for comparing with the comparison signal VC without using the additional reference voltage as the basis for comparing.

In other words, in comparison with the traditional SAR-ADC, the SAR-ADC 200 according to the embodiments of the invention may realize the operations of the offset cancellation and the analog-to-digital conversion for the comparison circuit 230 without using the additional reference voltage.

On the other hand, in the present embodiment, a deposition amount of the comparison units 232_1 to 232_M is determined according to a bit amount N of the SAR-ADC 200. More specifically, M is at least equal to one quarter of N. For instance, in case the SAR-ADC 200 is designed to include a 4-bits resolution (i.e., n=4), it is required to dispose at least one comparison circuit 232_1 (i.e., M≥1) in the comparison circuit 230; in case the SAR-ADC 200 is designed to include a 8-bits resolution (i.e., n=8), it is required to dispose at least two comparison circuits 232_1 and 232_2 connected in series (i.e., M≥1) in the comparison circuit 230; and the rest may be deduced by analogy.

By disposing multiple comparison units 232_1 to 232_M connected in series, an overall gain of the comparison circuit 230 may be divided by each of the comparison units 232_1 to 232_M, and thus each of the comparison units 232_1 to 232_M may be driven by less current to work favorably at its operating point. Accordingly, as compared to the comparison circuit composed of one single comparator, the comparison units 232_1 to 232_M of the present embodiment does not cause serious noise interference due to the operating current being overly great even if the comparison units are operated in high frequency.

Figure 3:
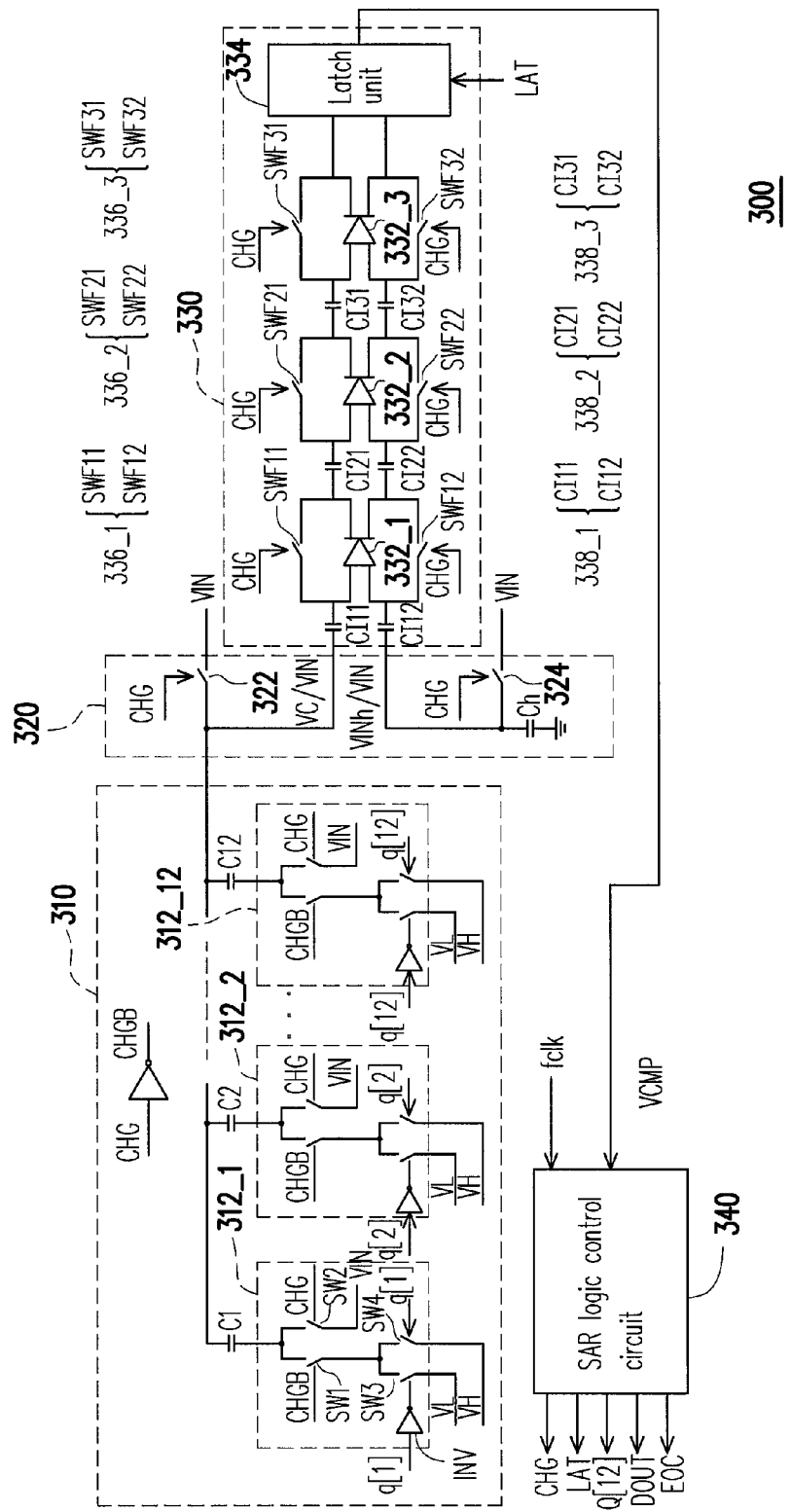
FIG. 3 is a schematic diagram of a successive approximation register analog-to-digital converter according to yet another embodiment of the invention.

Hereinafter, the invention is further described by using a specific circuit scheme of a 12-bits SAR-ADC 300 depicted in FIG. 3. FIG. 3 is a schematic view of a SAR-ADC according to yet another embodiment of the invention.

Referring to FIG. 3, in the present embodiment, the 12-bits SAR-ADC 300 (i.e., N=12) includes a DAC circuit 310, a sample-and-hold circuit 320, a comparison circuit 330 and a SAR logic control circuit 340. The DAC circuit 310 includes a capacitor array composed of twelve capacitors C1 to C12 and switch modules 312_1 to 312_12 corresponding to the capacitors C1 to C12 respectively. The comparison circuit 330 includes three comparison units 332_1 to 332_3 (i.e., M=3) connected in series, a latch unit 334, feedback units 336_1 to 336_3 and capacitor units 338_1 to 338_3 corresponding to the comparing units 332_1 to 332_3. In addition, a specific architecture of the sample-and-hold circuit 320 is similar to that of the foregoing embodiment, and includes sample switches 324 and 224 and a hold capacitor Ch.

Specifically, in the DAC circuit 310 of the present embodiment, each of the switch modules 312_1 to 312_12 may be realized by a circuit scheme composed of a plurality of switches and an inverter. Hereinafter, the switch module 312_1 is taken as an example. The switch module 312_1 includes switches SW1 to SW4 and an inverter INV. First terminals of the switches SW1 and SW2 are commonly coupled to a second terminal of the capacitor C1, a second terminal of the switch SW2 receives the analog input signal VIN, and control terminals of the switches SW1 and SW2 receive control signals CHGB and CHG respectively, wherein the control signals CHGB and CHG are mutually inverse. First terminals of the switches SW3 and SW4 are commonly coupled to a second terminal of the switch SW1, and second terminals of the switches SW3 and SW4 receive the low logic voltage VL and the high logic voltage VH respectively, wherein a control terminal of the switch SW4 is controlled by the logic state of the bit q[1] of a digital logic signal Q[12] to be turned on or off, and a control terminal of the switch SW3 is controlled by the logic state of the bit q[1] through the inverter INV to be turned on or off. In other words, the switches SW1 and SW2 (the switches SW3 and SW4) are alternately turned on in a complementary manner, so as to realize the function of selectively providing one of the analog input signal VIN, the high logic voltage VH and the low logic voltage VL. Specific architectures of the rest of the switch modules 312_2 to 312_12 are similar to that of the switch module 312_1, and thus related descriptions are not repeated hereinafter.

In the comparison circuit 330 of the present embodiment, the feedback unit 336_1 includes feedback switches SWF11 and SWF12, the feedback unit 336_2 includes feedback switches SWF21 and SWF22, and the feedback unit 336_3 includes feedback switches SWF31 and SWF32. The feedback switches SWF11, SWF21 and SWF31 each is coupled between a positive input terminal and a positive output terminal of the corresponding one of the comparison units 332_1, 332_2 and 332_3, and the feedback switches SWF12, SWF22 and SWF32 each is coupled between a negative input terminal and a negative output terminal of the corresponding one of the comparison units 332_1, 332_2 and 332_3.

In addition, the capacitor unit 338_1 includes input capacitors CI11 and CI12, the capacitor unit 338_2 includes input capacitors CI21 and CI22, and the capacitor unit 338_3 includes input capacitors CI31 and CI32. The positive input terminal of a first-stage comparison unit 332_1 is coupled to first terminals of the capacitors C1 to C12 and a second terminal of the sample switch 322 through the capacitor CI11, and the negative input terminal of the first-stage comparison unit 332_1 is coupled to a second terminal of the sample switch 324 and a first terminal of the hold capacitor Ch through the capacitor CI12. The positive input terminal and the negative input terminal of a second-stage comparison unit 322_2 are coupled to the positive output terminal and the negative output terminal of the first-stage comparison unit 322_1 respectively through the input capacitors CI21 and CI22. The positive input terminal and the negative input terminal of a third-stage comparison unit 322_3 are coupled to the positive output terminal and the negative output terminal of the second-stage comparison unit 322_2 respectively through the input capacitors CI31 and CI32, and the positive output terminal and the negative output terminal of the third-stage comparison unit 332_3 are both coupled to the latch unit 334.

Overall operations of the analog-to-digital conversion of the SAR-ADC 300 are described below by reference with a signal timing diagram of FIG. 4.

Figure 4:
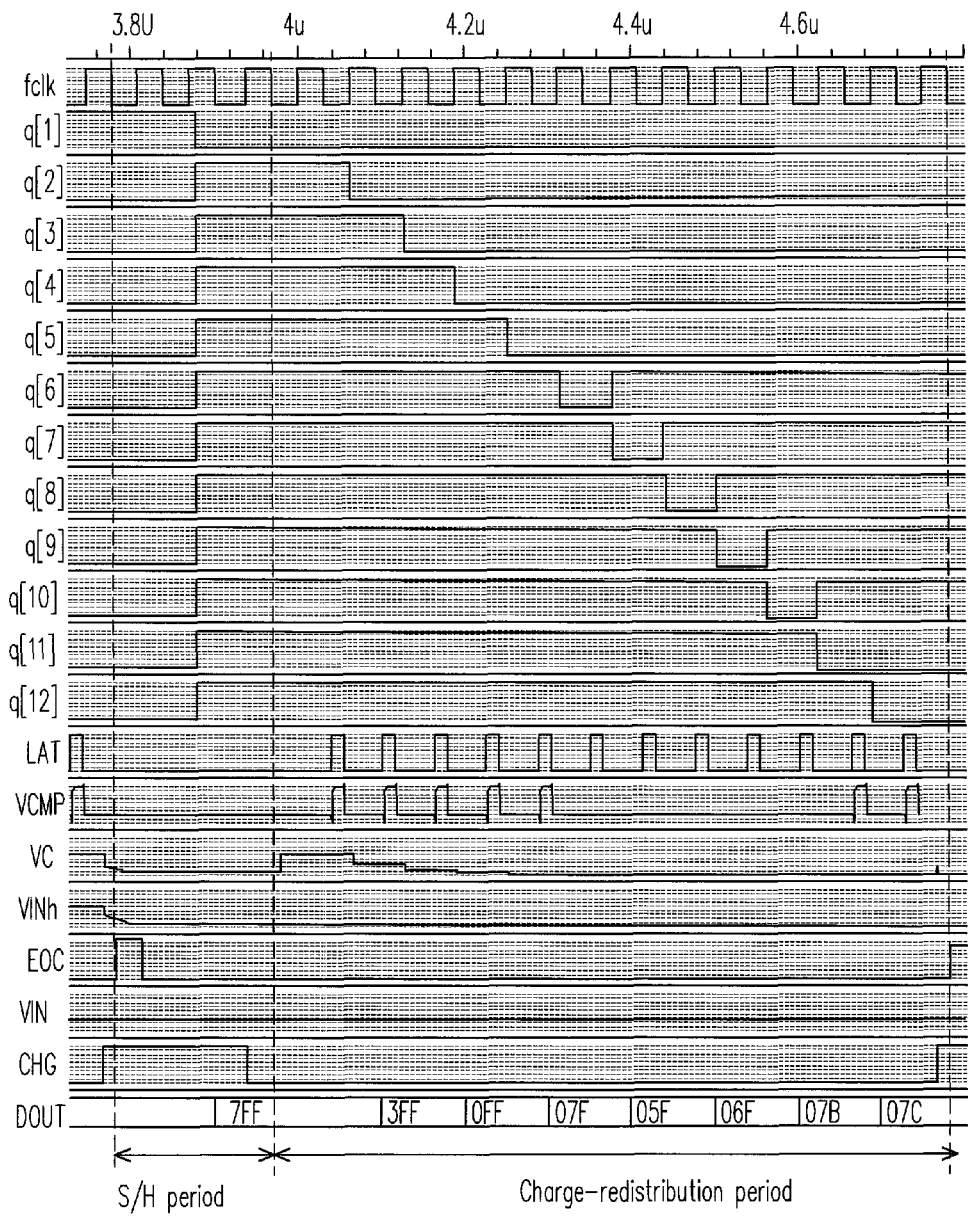
FIG. 4 is a signal timing diagram of the successive approximation register analog-to-digital converter according to the embodiment of FIG. 3.

Referring to FIG. 3 and FIG. 4 together, first, each signal received/outputted by the SAR logic control circuit 340 is described as follows. In the present embodiment, a clock signal fclk is a reference clock of the SAR logic control circuit 340. One corresponding digital output signal DOUT is decoded by the SAR logic control circuit 340 for each 16 clock cycles (referred to as one conversion circle hereinafter) of the clock signal fclk. Therein, the first three clock cycles are the sample-and-hold period of the SAR-ADC 300, and the last thirteen clock cycles are the charge-redistribution period of the SAR-ADC 300. Herein, the digital output signal DOUT is represented in hexadecimal, but the invention is not limited thereto. A control signal LAT is a signal for controlling operations of the latch unit 334. A control signal EOC is an end of conversion signal for instructing starting/ending of the analog-to-digital conversion. The SAR logic control circuit 340 sends the current digital output signal DOUT when the control signal EOC is enabled. In addition, the control signal CHG and the digital logic signal Q[12] are the same to those described in the foregoing embodiment.

Specifically, when the SAR-ADC 300 enters the sample-and-hold period according to the enabled control signal EOC, the SAR logic control circuit 340 may provide the enabled control signal CHG to turn on the sample switches 322 and 324 and the feedback switches SWF11 to SWF32, and make each of the switch modules 312_1 to 312_12 to selectively provide the analog input signal VIN to the corresponding capacitors C1 to C12 in response to the enabled control signal CHG.

Under such configuration, the analog input signal VIN are simultaneously provided to the positive input terminal and the negative input terminal of each of the comparing units 332_1 to 332_3 through the input capacitors CI11 to CI32 and the feedback switches SWF11 to SWF32, so as to perform the operations of the offset cancellation for each of the comparing units 332_1 to 332_3, and initialize the common-mode gain of each of the comparing units 332_1 to 332_3 to 0. In addition, during this period, the analog input signal VIN may simultaneously charge the hold capacitor Ch, so that the analog input signal VIN may be held in the hold capacitor Ch. The analog input signal held by the hold capacitor Ch is represented by VINh.

Next, after entering the charge-redistribution period, the SAR logic control circuit 340 may switch the control signal CHG to disabled, so that the sample switches 322 and 324 and the feedback switches SWF11 to SWF32 are turned off, and each of the switch modules 312_1 to 312_12 is changed to be controlled by the corresponding bits q[1] to q[12] of the digital logic signal Q[N] to determine whether to provide the high logic voltage VH or the low logic voltage VL to the corresponding capacitors C1 to C12. In the present embodiment, the logic state of the digital logic signal Q[N] preset and provided by the SAR logic control circuit 340 is "011111111111" for example, and voltage levels of the high logic voltage VH, the low logic voltage VL and the analog input signal VIN are, for example, 3V, 0V and 0.1V, respectively.

During the charge-redistribution period, the SAR logic control circuit 340 may sequentially adjust a first bit q[1] to a twelfth bit q[12] of the digital logic signal Q[12] according to the comparison result signal VCMP during twelve pulse periods of the control signal LAT. More specifically, during a first pulse period of the control signal LAT, the DAC circuit 310 may generate the comparison signal VC with voltage level approximately being 1.5V according to the logic state of the digital logic signal Q[12] being "011111111111". In this case, the comparison circuit 330 determines that the voltage level of the comparison signal VC (1.5V) is greater than that of the analog input signal VIN (0.1V), and thereby sends the enabled comparison result signal VCMP. Therefore, according to the enabled comparison result signal VCMP, the SAR logic control circuit 340 maintains the first bit q[1] at the logic level "0" and successively adjust the logic state of the second bit q[2] to "0".

Next, during the second pulse period of the control signal LAT, the DAC circuit 310 generates the comparison signal VC with the voltage level approximately being 0.75V according to the logic state of the digital logic signal Q[12] being "001111111111". In this case, the comparison circuit 330 still determines that the voltage level of the comparison signal VC (0.75V) is greater than that of the analog input signal VIN (0.1 V). Accordingly, the enabled comparison result signal VCMP is sent once again. Therefore, according to the enabled comparison result signal VCMP, the SAR logic control circuit 340 also maintains the second bit q[2] at the logic level "0" and successively adjust the logic state of the third bit q[3] to "0". Thereafter, the logic levels of the bits q[3] to q[12] are sequentially determined according to above method, and thus related descriptions thereof are not repeated hereinafter.

In view of FIG. 4, during the twelve pulse periods of the control signal LAT, the comparison circuit 340 will generate the comparison result signal with the logic state being "111110000011", so that the SAR logic control circuit 340 may eventually adjust the logic state of the digital logic signal Q[12] to be "000001111100". Accordingly, when the control signal EOC is enabled once again, the SAR logic control circuit 340 may send the digital output signal DOUT with a digital value "07C" (as in hexadecimal) according to the logic state of the digital logic signal Q[12] being "000001111100". That is, after one conversion circle, the SAR logic control circuit 340 may convert the analog input signal VIN into the digital output signal DOUT with the digital value "07C", so as to complete the operations of the analog-to-digital conversion.

Furthermore, it is worth mentioning that, the control signal CHG of the present embodiment may be designed to be pre-switched to enabled before entering the conversion circle (i.e., transition times of the control signals CHG and EOC are separated by a delay period). Accordingly, the corresponding switches may be instantly turned on when the SAR-ADC 300 enters the sample-and-hold period, so as to perform the operations of the offset cancellation in advance. However, the invention is not limited thereto.

In summary, the embodiments of the invention propose a SAR-ADC, which is capable of simply using the analog input signal to serve as the common-mode reference voltage required for the analog-to-digital conversion and the offset cancellation. Therefore, the SAR-ADC according to the embodiments of the invention may realize the operations of the offset cancellation and the analog-to-digital conversion without using the additional reference voltage, and thereby simplify the overall circuit design. In addition, the proposed circuit architecture of the comparison units connected in series may also effectively reduce the noise interference of the SAR-ADC operated in high frequency, and thereby allow the SAR-ADC according to the embodiments of the invention to provide a more preferable signal-to-noise ratio characteristic.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A successive approximation register analog-to-digital converter, comprising:

a digital-to-analog conversion circuit, configured to convert an N-bits digital logic signal into a comparison signal in analog form, wherein N is a positive integer;

a sample-and-hold circuit, configured to sample and hold an analog input signal;

a comparison circuit, coupled to the digital-to-analog conversion circuit and the sample-and-hold circuit, and configured to use the analog input signal held by the sample-and-hold circuit as a basis for comparing with the comparison signal and thereby generate a comparison result signal; and a successive approximation register logic control circuit, configured to provide the N-bits digital logic signal and determine a logic state of each of bits of the digital logic signal one by one according to the comparison result signal, so as to generate a digital output signal related to the analog input signal, wherein the comparison circuit comprises:

a M-stage of comparison units connected in series, wherein a first-stage comparison unit receives the analog input signal and the comparison signal from the sample-and-hold circuit and the digital-to-analog conversion circuit, respectively;

a latch unit, coupled to an output terminal of a $M^{th}$-stage comparison unit, and configured to latch a comparison result from the comparison units, and thereby generate the comparison result signal, wherein M is a positive integer, and M is at least one quarter of N;

a M-number of feedback units, each coupled between an input terminal and an output terminal of corresponding one of the comparison units; and a M-number of capacitor units, each coupled to the input terminal of corresponding one of the comparison units.

2. The successive approximation register analog-to-digital converter of claim 1, wherein each of the comparison units comprises a differential output, and except for the last-stage comparison unit, a positive output terminal and a negative output terminal of a previous-stage comparison unit are coupled to a positive input terminal and a negative input terminal of a next-stage comparison unit respectively, and each of the feedback units comprises:

a first feedback switch, coupled between the positive input terminal and the positive output terminal of the corresponding comparison unit; and a second feedback switch, coupled between the negative input terminal and the negative output terminal of the corresponding comparison unit, wherein the first and second feedback switches are controlled of the successive approximation register logic control circuit to be turned on or off.

3. The successive approximation register analog-to-digital converter of claim 2, wherein each of the capacitor units comprises:

a first input capacitor, coupled to the positive input terminal of the corresponding comparison unit; and a second input capacitor, coupled to the negative input terminal of the corresponding comparison unit.

4. The successive approximation register analog-to-digital converter of claim 2, wherein the successive approximation register logic control circuit turns on the first and second feedback switches of the feedback units during a sample-and-hold period, and turns off the first and second feedback switches of the feedback units during a charge-redistribution period.

5. The successive approximation register analog-to-digital converter of claim 1, wherein the sample-and-hold circuit comprises:

a first sample switch, having a first terminal receiving the analog input signal, and a second terminal coupled to one of the positive input terminal and the negative input terminal of the first-stage comparison unit;

a second sample switch, having a first terminal receiving the analog input signal, and a second terminal coupled to another one of the positive input terminal and the negative input terminal of the first-stage comparison unit; and a hold capacitor, having a first terminal coupled to the second terminal of the second sample switch, and a second terminal coupled to a ground terminal.

6. The successive approximation register analog-to-digital converter of claim 5, wherein the successive approximation register logic control circuit turns on the first and second sample switches during a sample-and-hold period and thus holds the analog input signal in the hold capacitor, and turns off the first and second sample switches during a charge-redistribution period.

7. The successive approximation register analog-to-digital converter of claim 5, wherein the digital-to-analog conversion circuit comprises:

a N-number of capacitors, wherein first terminals of the capacitors are commonly coupled to the second terminal of the first sample switch; and a N-number of switch modules, coupled to second terminals of the capacitors respectively, and controlled by the successive approximation register logic control circuit to selectively provide one of a high logic voltage, a low logic voltage and the analog input signal to the corresponding capacitors.

8. The successive approximation register analog-to-digital converter of claim 7, wherein the switch modules are controlled by the successive approximation register logic control circuit to provide the analog input signal to the corresponding capacitors during a sample-and-hold period, and the switch modules are controlled by the logic state of each of the bits of the digital logic signal to sequentially provide the high logic voltage or the low logic voltage to the corresponding capacitors during a charge-redistribution period, so as to generate the comparison signal.

9. The successive approximation register analog-to-digital converter of claim 8, wherein capacitance ratios of a first capacitor to a $N^{th}$ capacitor are sequentially $2^{N-1}$ to $2^0$, and a most significant bit (MSB) to a least significant bit (LSB) of the N-bits digital logic signal sequentially and correspondingly control a first switch module to a $N^{th}$ switch module during the charge-redistribution period.

* * * * *